(12) United States Patent
Gruber

(10) Patent No.: US 12,278,074 B2
(45) Date of Patent: Apr. 15, 2025

(54) PROTECTION CIRCUIT FOR A SIMULATED BATTERY CELL

(71) Applicant: dSPACE GmbH, Paderborn (DE)

(72) Inventor: Paul Gruber, Paderborn (DE)

(73) Assignee: DSPACE GMBH, Paderborn (DE)

( * ) Notice: Subject to any disclaimer, the term of this patent is extended or adjusted under 35 U.S.C. 154(b) by 163 days.

(21) Appl. No.: 18/064,348

(22) Filed: Dec. 12, 2022

(65) Prior Publication Data

US 2023/0187159 A1 Jun. 15, 2023

(30) Foreign Application Priority Data

Dec. 13, 2021 (DE) .......................... 102021006149.7
Dec. 13, 2021 (EP) ...................................... 21213957

(51) Int. Cl.
*H02H 9/00* (2006.01)
*G01R 31/378* (2019.01)
*H01H 83/10* (2006.01)

(52) U.S. Cl.
CPC ........... *H01H 83/10* (2013.01); *G01R 31/378* (2019.01)

(58) Field of Classification Search
None
See application file for complete search history.

(56) References Cited

U.S. PATENT DOCUMENTS

| 5,534,788 | A | * | 7/1996 | Smith | ............... | H01L 23/49541 |
| | | | | | | 327/537 |
| 2013/0169038 | A1 | * | 7/2013 | King | .................... | H02J 7/0031 |
| | | | | | | 307/66 |
| 2020/0227934 | A1 | * | 7/2020 | Zhang | ..................... | B60L 53/00 |
| 2021/0226444 | A1 | * | 7/2021 | Fang | ................ | H03K 17/08142 |
| 2022/0399725 | A1 | * | 12/2022 | Zhang | ................. | H02J 7/00047 |

FOREIGN PATENT DOCUMENTS

| EP | 2128969 | A2 | | 12/2009 | |
| EP | 3985826 | A1 | * | 4/2022 | .......... H02J 7/00302 |

* cited by examiner

*Primary Examiner* — Stephen W Jackson
(74) *Attorney, Agent, or Firm* — LEYDIG, VOIT & MAYER, LTD.

(57) ABSTRACT

A protection circuit for a simulated battery cell having an output comprising an output voltage includes: at least one MOSFET connected to the output of the simulated battery cell for short-circuiting the output of the simulated battery cell; a capacitor connected to a gate electrode of the at least one MOSFET; an overvoltage detection device configured to charge the capacitor with the output voltage based on an overvoltage limit of the output voltage being exceeded; and a threshold voltage detection device configured to release the gate electrode based on a threshold value of a voltage at the capacitor not being reached.

8 Claims, 1 Drawing Sheet

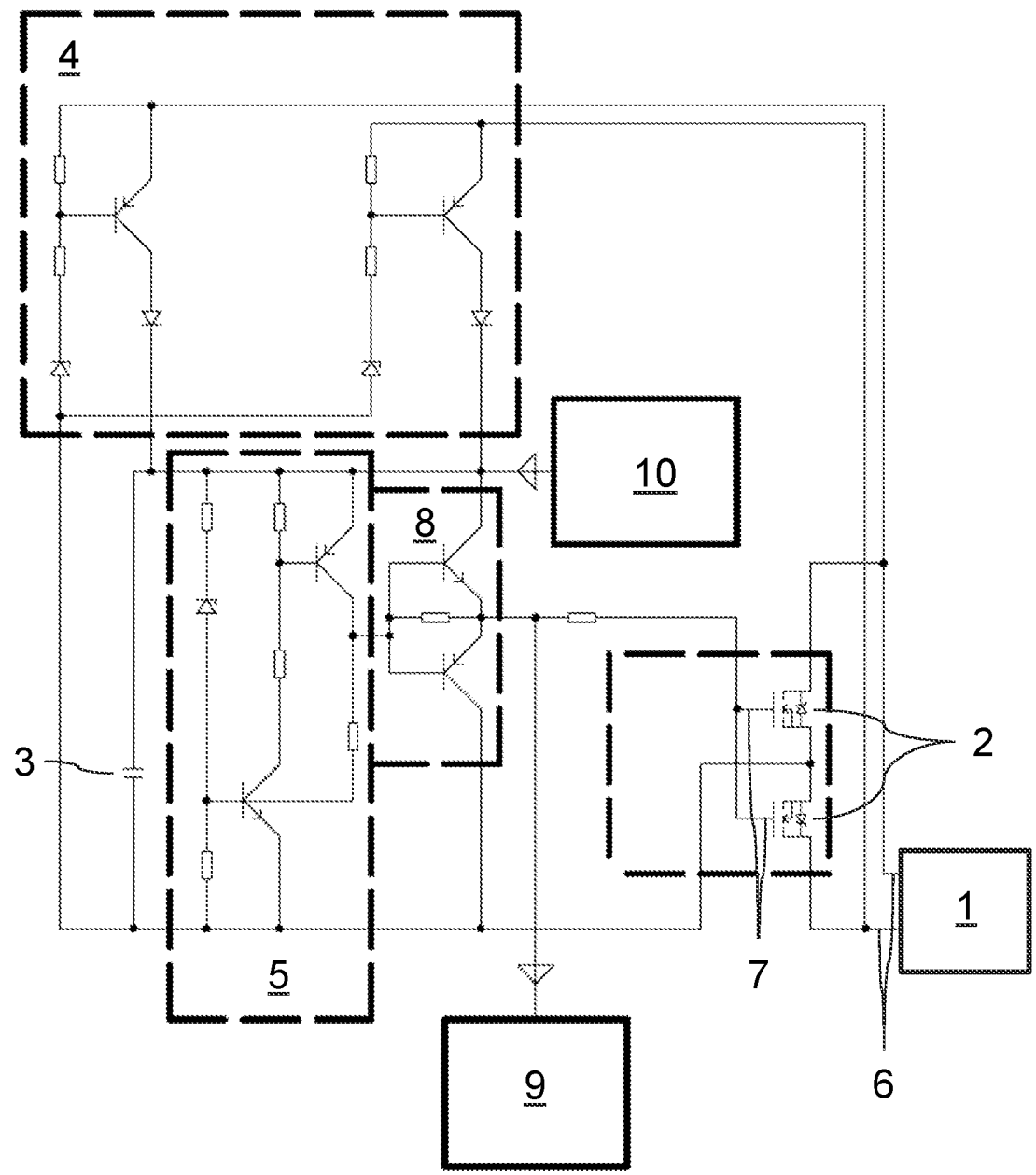

PROTECTION CIRCUIT FOR A SIMULATED BATTERY CELL

CROSS-REFERENCE TO PRIOR APPLICATIONS

This application claims benefit to German Patent Application No. DE 102021006149.7 and European Patent Application No. EP 21213957.0, filed on Dec. 13, 2021, which are hereby incorporated by reference herein.

FIELD

The invention relates to a protection circuit for a simulated battery cell comprising the simulated battery cell having an output comprising an output voltage.

BACKGROUND

"Battery cell voltage emulation boards", abbreviated to BCVEB, which enable emulation or simulation of high-voltage batteries at cell level, are known for computer-controlled test systems, which, together with an associated system to be tested, form a closed control loop, i.e., so-called hardware-in-the-loop test systems, abbreviated to HIL test systems or HIL simulators, provided in particular for the testing of battery management systems, abbreviated to BMS. Such BCVEBs (battery cell voltage emulation boards) emulate or simulate a controllable, highly accurate terminal voltage for individual battery cells. Depending on the battery type and the test focus, a plurality of boards, i.e., a plurality of assemblies, can be used in an HIL system.

Such a simulation can include several hundred battery cells connected in series and having a total voltage above 1000 V. In the previous sentence and the text below, the term "battery cell" is to be interpreted as a "simulated battery cell", unless otherwise indicated in the respective context. A connected customer system can remove or also supply energy from each battery cell of such a simulator, frequently to test charge balancing processes or charge balancing operations in a customer system, in particular in the circuits thereof. However, the supply, as well as malfunctions in the simulator or customer system, can lead to impermissibly high cell voltages and power losses in the simulator, which can cause consequential damage in the simulator.

However, a normal regulation of a source in the event of an overload cannot be transmitted to a sink. This is because, in the case of high total voltage, opening an overloaded battery cell would be disadvantageous in terms of consequential damage and substantially more complex in terms of circuitry. A technical defect or failure of an individual battery cell of the simulator can also lead to an overvoltage of said battery cell in the overall system that is still running and thus to further damage in the simulator.

SUMMARY

In an exemplary embodiment, the present invention provides a protection circuit for a simulated battery cell having an output comprising an output voltage. The protection circuit includes: at least one metal-oxide-semiconductor field-effect transistor (MOSFET) connected to the output of the simulated battery cell for short-circuiting the output of the simulated battery cell; a capacitor connected to a gate electrode of the at least one MOSFET; an overvoltage detection device configured to charge the capacitor with the output voltage based on an overvoltage limit of the output voltage being exceeded; and a threshold voltage detection device configured to release the gate electrode based on a threshold value of a voltage at the capacitor not being reached.

BRIEF DESCRIPTION OF THE DRAWING

Subject matter of the present disclosure will be described in even greater detail below based on the exemplary FIGURE. All features described and/or illustrated herein can be used alone or combined in different combinations. The features and advantages of various embodiments will become apparent by reading the following detailed description with reference to the attached drawing, which illustrates the following:

FIG. 1 shows a protection circuit for a simulated battery cell as a circuit diagram according to a preferred embodiment of the invention.

DETAILED DESCRIPTION

Exemplary embodiments of the present invention provide a protection circuit for a simulated battery cell, which solves the problems described above.

In an exemplary embodiment, the present invention provides a protection circuit for a simulated battery cell, comprising: the simulated battery cell having an output comprising an output voltage, at least one MOSFET connected to the output of the simulated battery cell for short-circuiting the same, a capacitor connected to a gate electrode of the at least one MOSFET, an overvoltage detection device configured to charge the capacitor with the output voltage when an overvoltage limit of the output voltage is exceeded, and a threshold voltage detection device, configured to release the gate electrode when a voltage at the capacitor falls below a threshold value.

The protection circuit, also called a clamp circuit or crowbar, allows for extremely effective protection of a simulator against consequential damage resulting from impermissibly high cell voltages of the battery cell. This is because the simulated battery cell can be short-circuited by the at least one MOSFET in the event of the overvoltage limit. To this end, the protection circuit monitors the output voltage of the simulated battery cell. When the overvoltage limit is exceeded, the capacitor is charged, which then actuates the gate electrode of the at least one MOSFET. The at least one MOSFET is switched parallel to the output of the battery cell, so that the battery cell is short-circuited by actuating the gate electrode. Since the capacitor only slowly discharges, within a discharge time interval influenced by the circuit arrangement, the threshold voltage detection device releases the gate electrode again before the at least one MOSFET transitions into a partially conductive operation in the event of decreasing gate voltage, which operation would be accompanied by a relatively high loss of power. As a result, the output voltage can rise again above the overvoltage limit, so that the cycle described above can begin again. As a result of the protection circuit, opening an overloaded battery cell, which can result in consequential damage and would be significantly more complex in terms of circuitry than the protection circuit, is no longer required.

The protection circuit can be used in particular for so-called hardware-in-the-loop simulators, also called HIL systems, for test devices of battery management systems, BMS, and specifically for so-called "battery cell voltage emulation boards", infrequently referred to as "battery cell voltage emulation assembly", which facilitate a simulation of high-voltage batteries at cell level. In this case, the protection circuit can contain a plurality of battery cells connected in series, for example three or four battery cells connected in series, which can be short-circuited by the at least one MOSFET. Likewise, each individual battery cell can be provided with the protection circuit. In typical applications, a customer system connected to the protection circuit can remove or also supply energy from each battery cell of such a simulator for the purpose of charge balancing. The latter applications are often referred to as "charge balancing" or "battery balancing", less frequently as "battery charge balancing".

A plurality of conventional simulated battery cells can be used as battery cells. The at least one MOSFET with its drain and source electrodes is preferably switched parallel to the output. The capacitor is preferably arranged to actuate the gate electrode. The capacitor can preferably be charged via the simulated battery cell, in particular independently of other available operating voltages. For this purpose, the capacitor is preferably configured with respect to its capacity to provide energy for actuating the gate electrode at least for a limited time. The overvoltage limit can be, for example, 9 V, while the threshold value can be 4 V. Particularly preferably, the capacitor is connected to the gate electrode via the threshold voltage detection device. Release of the gate electrode means, in particular, drawing it on a source potential of the MOSFET so that the MOSFET is no longer conductive, i.e., no longer short-circuits the output.

According to a preferred embodiment, the protection circuit has two MOSFETs connected in series in opposite directions, wherein the capacitor is connected to respective gate electrodes of the two MOSFETs and the threshold voltage detection device is configured to release the gate electrodes when the threshold value of the voltage at the capacitor falls below the threshold value. The respective source electrodes of the MOSFETs are preferably connected to one another, so that the respective drain electrodes are switched parallel to the output. Particularly preferably, an electrode of the capacitor is connected to both gate electrodes via a threshold voltage detection device and the other electrode of the capacitor is connected to the two source electrodes.

According to another preferred embodiment, the threshold voltage detection device is designed as a hysteresis circuit. The hysteresis circuit is preferably designed as a Schmitt trigger and/or as a discrete circuit with bipolar transistors. For example, two mutually actuating transistors can be provided, wherein the base or the collector of the one transistor is connected to the emitter or the base of the other transistor via a respective resistor.

According to a further preferred embodiment, a gate driver for actuating the gate electrode is provided between the threshold voltage detection device and the at least one MOSFET. The gate driver preferably has a combination of two transistors for actuating the gate electrode, in particular an n-channel transistor and a p-channel transistor, the emitters of which are connected to the gate electrode.

According to another preferred embodiment, the protection circuit has a status line connected to the gate electrode for transmitting a status of the protection circuit to an FPGA and/or to an evaluation circuit. Such a status line can easily read out the status of the protection circuit, that is to say whether the protection circuit short-circuits the output or not.

According to a further preferred embodiment, the protection circuit comprises a tripping line connected to the overvoltage detection device for applying the limit to the overvoltage detection device. In this way, irrespective of the presence of the overvoltage limit, voltage can be applied to the gate electrode by the capacitor in order to short-circuit the output.

According to another preferred embodiment, the overvoltage detection device is configured to detect an exceeding of a positive and negative overvoltage limit of the output voltage and to charge the capacitor with the output voltage when the amount is exceeded. This means that the protection circuit can cause short-circuiting of the output even with a negative overvoltage limit.

In an exemplary embodiment, the present invention provides a method for protecting a simulation device fed by a simulated battery cell, comprising the steps of: charging a capacitor with the output voltage when an overvoltage limit of an output voltage of an output of the simulated battery cell is exceeded, wherein the capacitor is connected to a gate electrode of at least one MOSFET, and wherein the at least one MOSFET is connected to the output for short-circuiting the same, and releasing the gate electrode when a voltage at the capacitor falls below a threshold value.

The MOSFET becomes non-conductive upon the gate electrode of the MOSFET being released.

Further embodiments and advantages of the method will be appreciated by a person of ordinary skill in the art in analogy to the protection circuit described above.

FIG. 1 shows a protection circuit for a simulated battery cell 1 as a circuit diagram according to a preferred exemplary embodiment of the invention. In addition to the simulated battery cell 1, the protection circuit has at least one MOSFET 2, a capacitor 3, an overvoltage detection device 4, and a threshold voltage detection device 5. If only one simulated battery cell 1 is shown in FIG. 1, the protection circuit can span and protect a plurality of battery cells 1 connected in series. It is entirely possible for a total voltage across all battery cells 1 of a simulator, with its respective protection circuit according to the invention of each battery cell 1 or per group with a small number of battery cells 1 to be above 1000 V.

An output 6 of the simulated battery cell 1 having an output voltage is connected to the overvoltage detection device 4. The overvoltage detection device 4 comprises two transistors, the emitters of which are supplied by the output voltage. The respective collector of the transistors is connected via a respective diode to an electrode of the capacitor 3, wherein the anode of the diode faces the collector. The base of the transistors is supplied in each case via a resistor, which is connected in series with a further resistor and the cathode of a respective Z diode. In this way, when an overvoltage limit of the output voltage, for example 9 V, is exceeded, the capacitor 3 is charged with the output voltage by the overvoltage detection device 5.

The capacitor 3 is connected via the threshold voltage detection device 5 to a gate electrode 7 of the at least one MOSFET 2. In the present case, two MOSFETs 2 connected in series in opposite directions are provided, the respective gate electrodes 7 of which can be supplied by the capacitor 3 via the threshold voltage detection device 5. The at least one MOSFET 2 or in the present case the two MOSFETs 2 connected in series in opposite directions are connected to the output 6 of the simulated battery cell 1, so that the output 6 can be short-circuited.

The threshold voltage detection device 5 is embodied as a hysteresis circuit with two mutually controlling transistors, wherein the base or the collector of the one transistor is connected to the emitter or the base of the other transistor via a respective resistor. In this way, the threshold voltage detection device 6 is configured to release the gate electrodes 7 when a voltage at the capacitor 3 falls below a threshold value, for example 4 V. Furthermore, a gate driver 8 comprising a combination of two transistors for actuating the gate electrodes 7 is provided between the threshold voltage detection device 5 and the two MOSFETs 2.

The protection circuit further comprises a status line 9 connected to the gate electrodes 7 for transmitting a status of the protection circuit to an FPGA and/or to an evaluation circuit as well as a tripping line 10 connected to the overvoltage detection device 4 for applying the limit to the overvoltage detection device 4.

In summary, the protection circuit described above comprises the two MOSFETs 2 connected in series in opposite directions, which, as a rule, do not load the output 6 of the battery cell 1 or load it to a negligible extent, but can short-circuit in the event of a fault. The protection circuit monitors the output voltage at the output 6 of the battery cell 1. When the overvoltage limit is exceeded, whether positively or negatively, the capacitor 3 is charged and the gate electrodes 7 of the two MOSFETs are actuated by said capacitor 3. The battery cell 1 is thereby short-circuited.

Since the capacitor 3 discharges only slowly, the threshold voltage detection device 5 with hysteresis function releases the gate electrodes 7 again before the MOSFETs 2 transition, when the gate voltage drops, into a partially conducting operation, which would be accompanied by a large power loss. The cell voltage of the battery cell 1 can again rise above the overvoltage limit and the previously described cycle begins again after, for example, 11 ms.

The described embodiments are merely examples, which can be modified and/or supplemented in various ways within the scope of the claims. Any feature described for a particular embodiment can be used independently or in combination with other features in any other embodiment. Each feature that has been described for an embodiment of a specific category can also be used in a corresponding manner in an embodiment of another category.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

Simulated battery cell 1
MOSFET 2
Capacitor 3
Overvoltage detection device 4
Threshold voltage detection device 5
Output 6
Gate electrode 7
Gate driver 8
Status line 9
Tripping line 10

The invention claimed is:

1. A protection circuit for a simulated battery cell having an output comprising an output voltage, the protection circuit comprising:
   at least one MOSFET connected to the output of the simulated battery cell for short-circuiting the output of the simulated battery cell;
   a capacitor connected to a gate electrode of the at least one MOSFET;
   an overvoltage detection device configured to charge the capacitor with the output voltage based on an overvoltage limit of the output voltage being exceeded; and
   a threshold voltage detection device configured to release the gate electrode based on a threshold value of a voltage at the capacitor not being reached.

2. The protection circuit according to claim 1, wherein the at least one MOSFET comprises two MOSFETs connected in series in opposite directions;
   wherein the capacitor is connected to respective gate electrodes of the two MOSFETs; and
   wherein the threshold voltage detection device is configured to release the gate electrodes based on the threshold value of the voltage at the capacitor not being reached.

3. The protection circuit according to claim 1, wherein the threshold voltage detection device is a hysteresis circuit.

4. The protection circuit according to claim 1, wherein a gate driver for actuating the gate electrode is provided between the threshold voltage detection device and the at least one MOSFET.

5. The protection circuit according to claim 1, further comprising:
   a status line connected to the gate electrode for transmitting a status of the protection circuit to a field-programmable gate array (FPGA) and/or to an evaluation circuit.

6. The protection circuit according to claim 1, comprising:
   a tripping line connected to the overvoltage detection device for applying the overvoltage limit to the overvoltage detection device.

7. The protection circuit according to claim 1, wherein the overvoltage detection device is configured to detect an exceeding of an overvoltage limit of the output voltage and to charge the capacitor with the output voltage based on the overvoltage limit of the output voltage being exceeded.

8. A method for protecting a simulation device fed by a simulated battery cell, comprising:
   charging a capacitor with an output voltage of an output of the simulated battery cell based on an overvoltage limit of the output voltage being exceeded, wherein the capacitor is connected to a gate electrode of at least one MOSFET, and wherein the at least one MOSFET is connected to the output for short-circuiting the same; and releasing the gate electrode based on a voltage at the capacitor falling below a threshold value.

\* \* \* \* \*